United States Patent
Pitner et al.

(10) Patent No.: US 11,699,494 B2
(45) Date of Patent: Jul. 11, 2023

(54) PEAK AND AVERAGE ICC REDUCTION BY TIER-BASED SENSING DURING PROGRAM VERIFY OPERATIONS OF NON-VOLATILE MEMORY STRUCTURES

(71) Applicant: SanDisk Technologies LLC, Addison, TX (US)

(72) Inventors: Xue Bai Pitner, Sunnyvale, CA (US); Yu-Chung Lien, San Jose, CA (US); Deepanshu Dutta, Fremont, CA (US); Huai-yuan Tseng, San Ramon, CA (US); Ravi Kumar, Redwood City, CA (US)

(73) Assignee: SanDisk Technologies LLC

( * ) Notice: Subject to any disclaimer, the term of this patent is extended or adjusted under 35 U.S.C. 154(b) by 0 days.

(21) Appl. No.: 17/340,826

(22) Filed: Jun. 7, 2021

(65) Prior Publication Data
US 2022/0392552 A1   Dec. 8, 2022

(51) Int. Cl.
G11C 16/04     (2006.01)
G11C 16/34     (2006.01)
G11C 16/10     (2006.01)

(52) U.S. Cl.
CPC ...... *G11C 16/3459* (2013.01); *G11C 16/0483* (2013.01); *G11C 16/10* (2013.01); *G11C 2216/16* (2013.01)

(58) Field of Classification Search
CPC . G11C 16/3459; G11C 16/0483; G11C 16/10; G11C 2216/16
USPC ...................................... 365/185.22
See application file for complete search history.

(56) References Cited

U.S. PATENT DOCUMENTS

| | | | |
|---|---|---|---|
| 9,698,676 B1* | 7/2017 | Huynh | H02M 3/07 |
| 2008/0065812 A1* | 3/2008 | Li | G11C 16/3427 711/103 |
| 2012/0281479 A1* | 11/2012 | Kochar | G11C 16/3459 365/185.19 |
| 2013/0229868 A1* | 9/2013 | Koh | G11C 16/10 365/185.03 |
| 2014/0084936 A1* | 3/2014 | Pan | G01R 19/0092 324/509 |
| 2014/0085985 A1* | 3/2014 | Pan | G11C 5/145 327/536 |
| 2017/0316834 A1* | 11/2017 | Huynh | G11C 16/3422 |
| 2019/0371395 A1* | 12/2019 | Lin | G11C 11/5628 |

* cited by examiner

*Primary Examiner* — Tha-O H Bui
(74) *Attorney, Agent, or Firm* — Dickinson Wright PLLC; Steven C. Hurles

(57) ABSTRACT

A method for programming a memory block of a non-volatile memory structure, wherein the method provides, during a program verify operation, selecting only a partial segment of memory cells of a memory block for bit scan mode, applying a sensing bias voltage to one or more bit lines of the memory block associated with the selected memory cells, and initiating a bit scan mode of the selected memory cells.

20 Claims, 17 Drawing Sheets

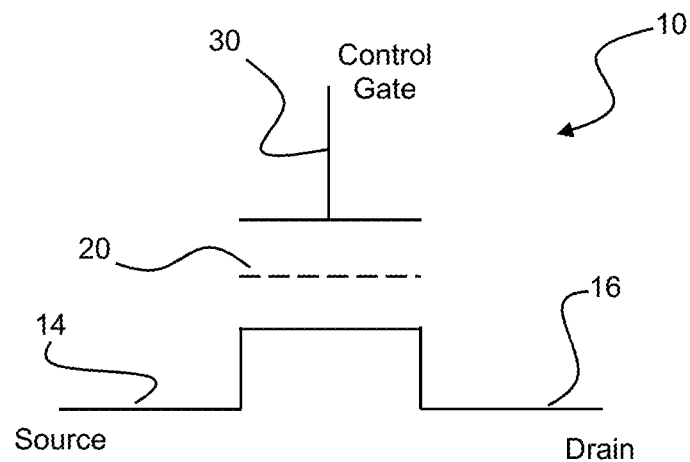
FIG. 2 – Prior Art
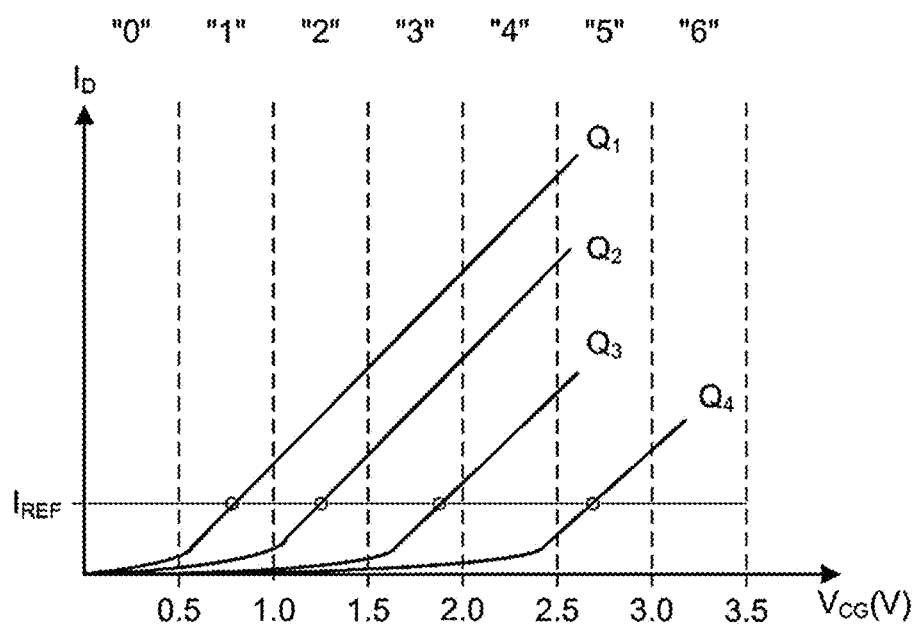
FIG. 3 – Prior Art

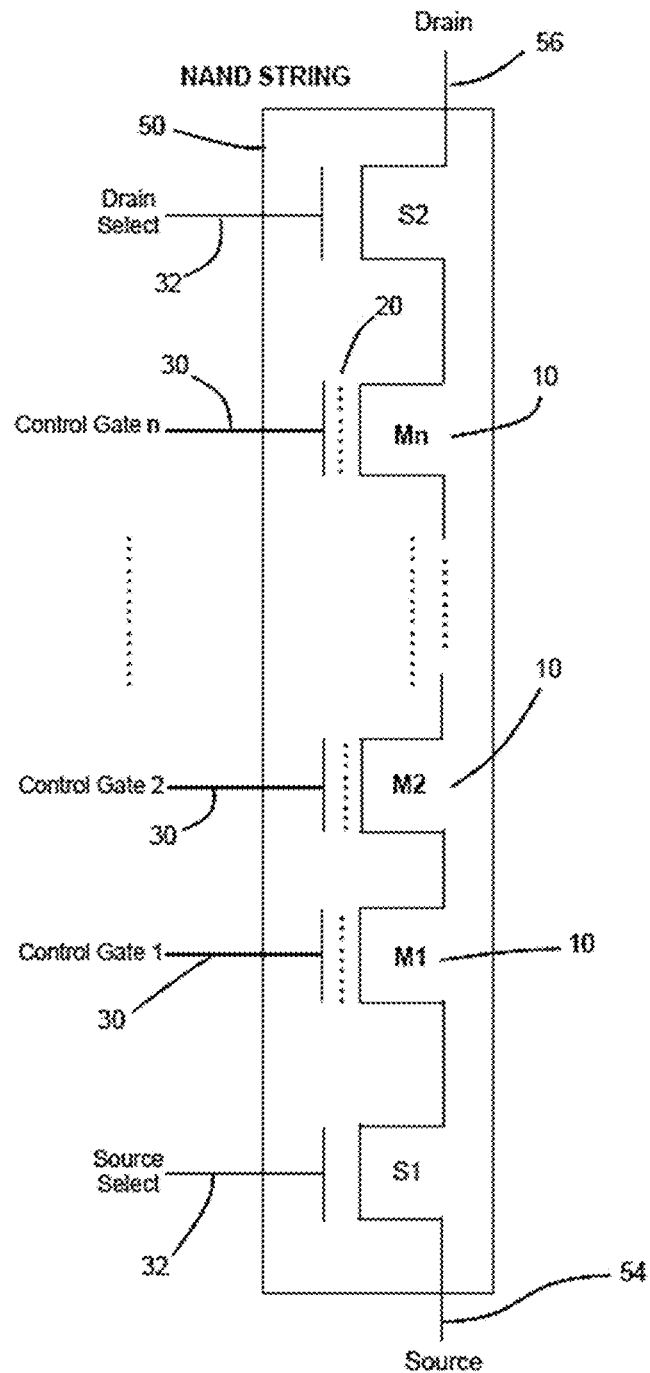
FIG. 4A – Prior Art

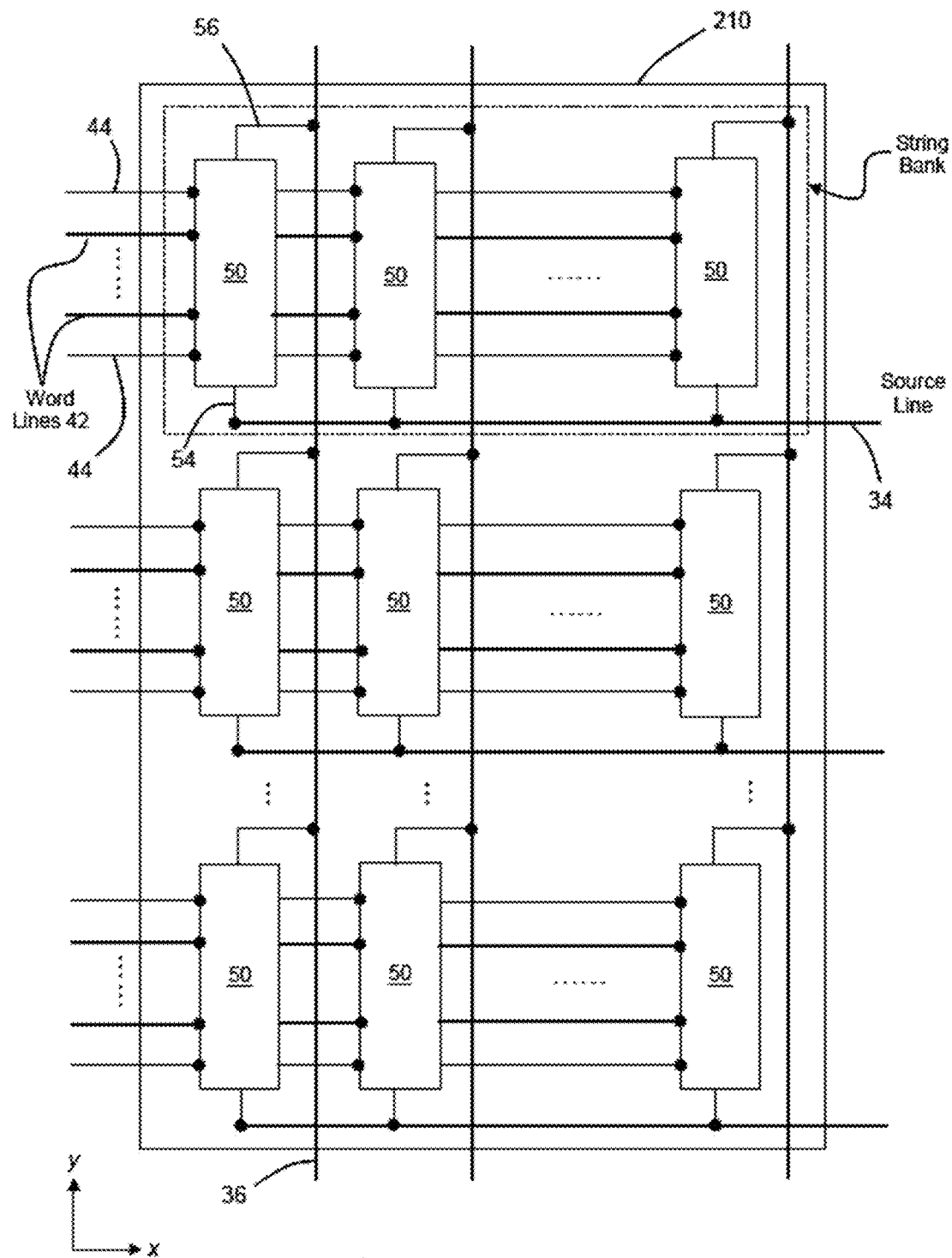
*FIG. 4B – Prior Art*

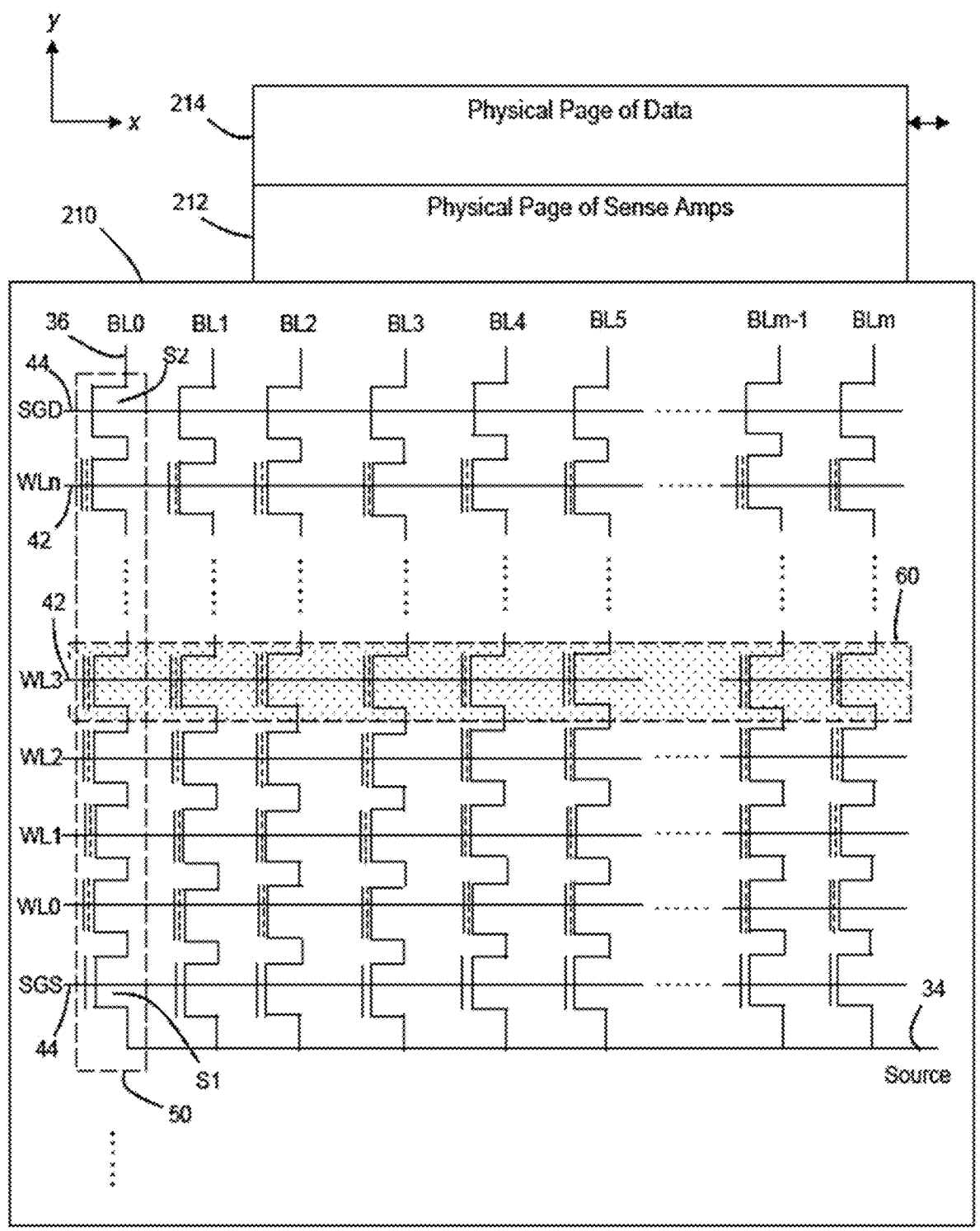
FIG. 5 – Prior Art

*FIG. 6A – Prior Art*
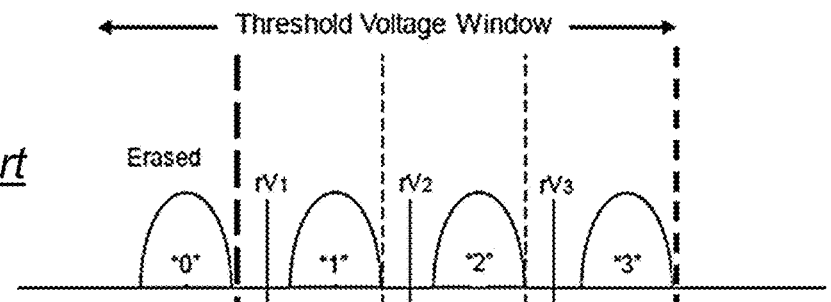
*FIG. 6B – Prior Art*
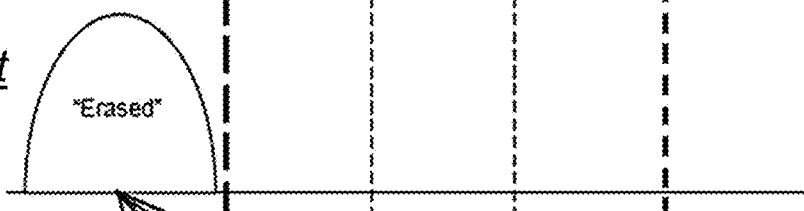
*FIG. 6C – Prior Art*
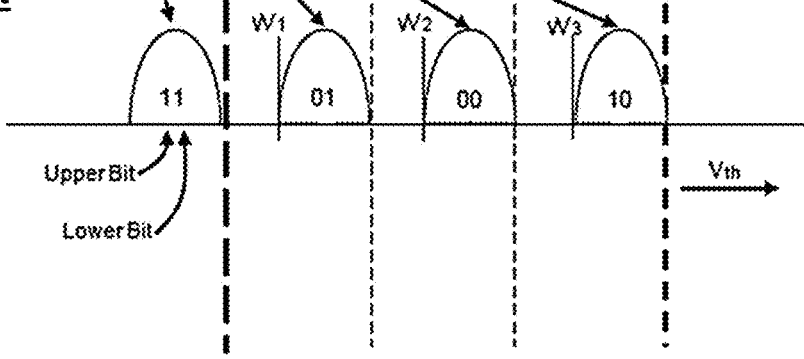

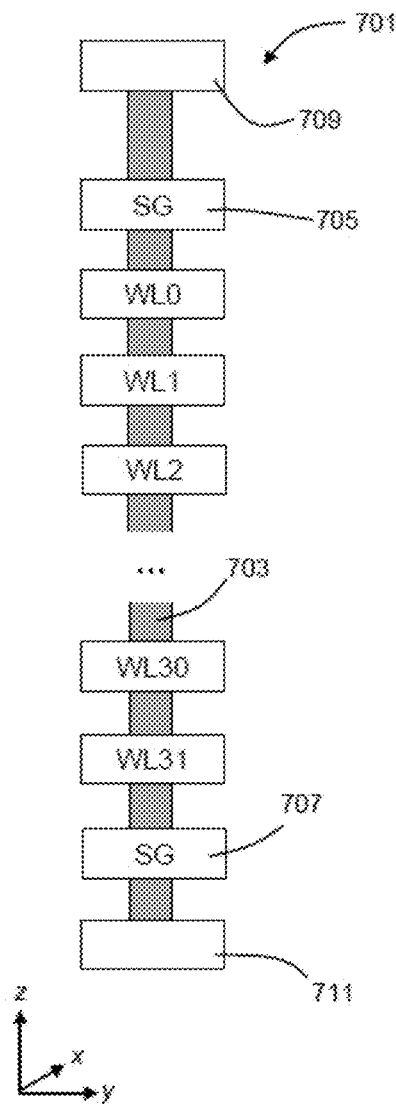
FIG. 7 – Prior Art

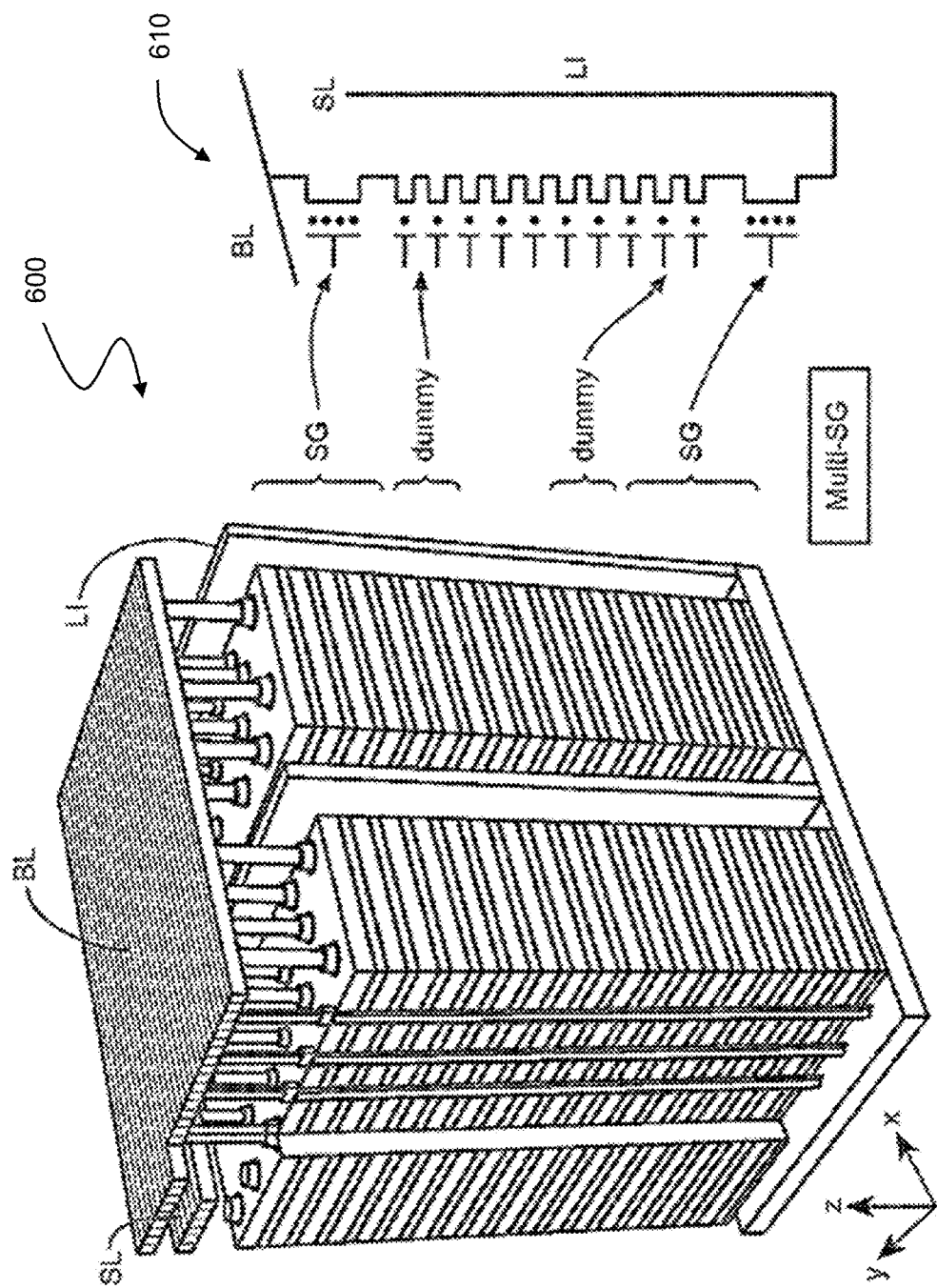
FIG. 8 – Prior Art

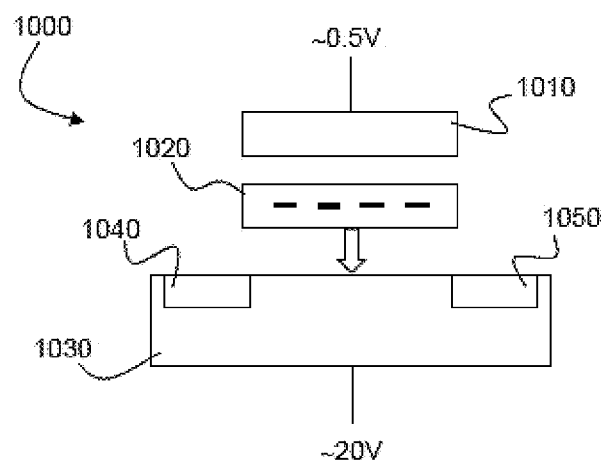
*FIG. 9A – Prior Art*
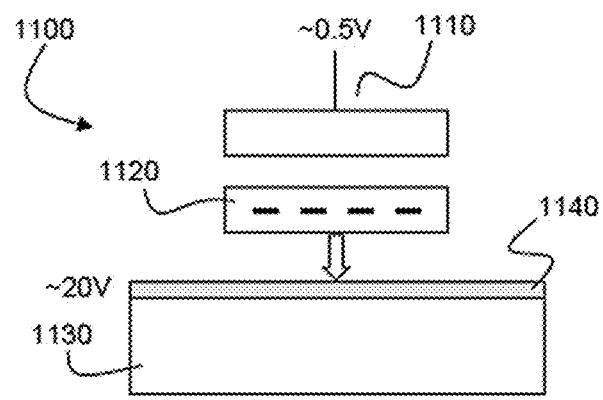
*FIG. 9B – Prior Art*

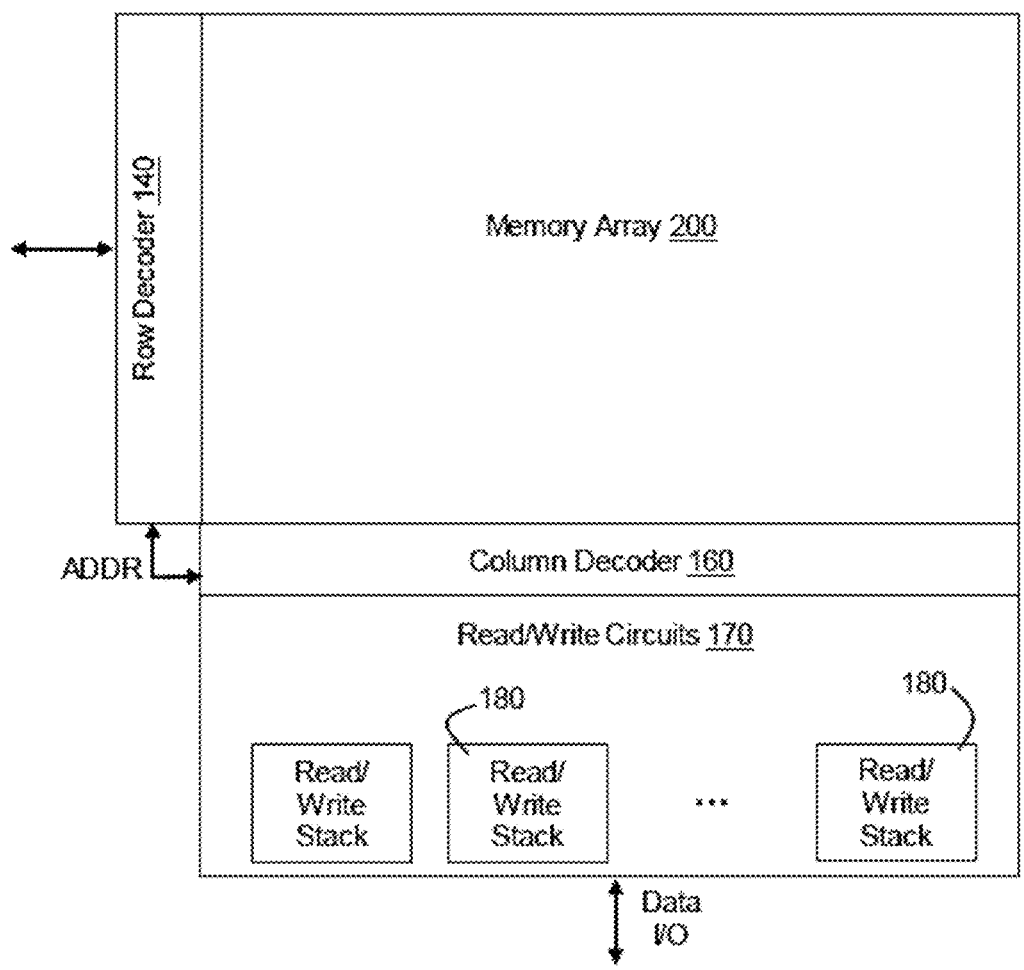
*FIG. 10 – Prior Art*
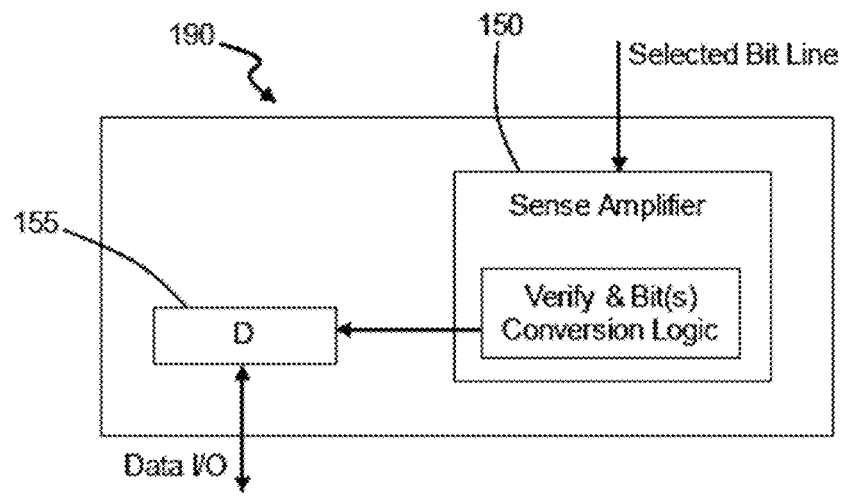
*FIG. 11 – Prior Art*

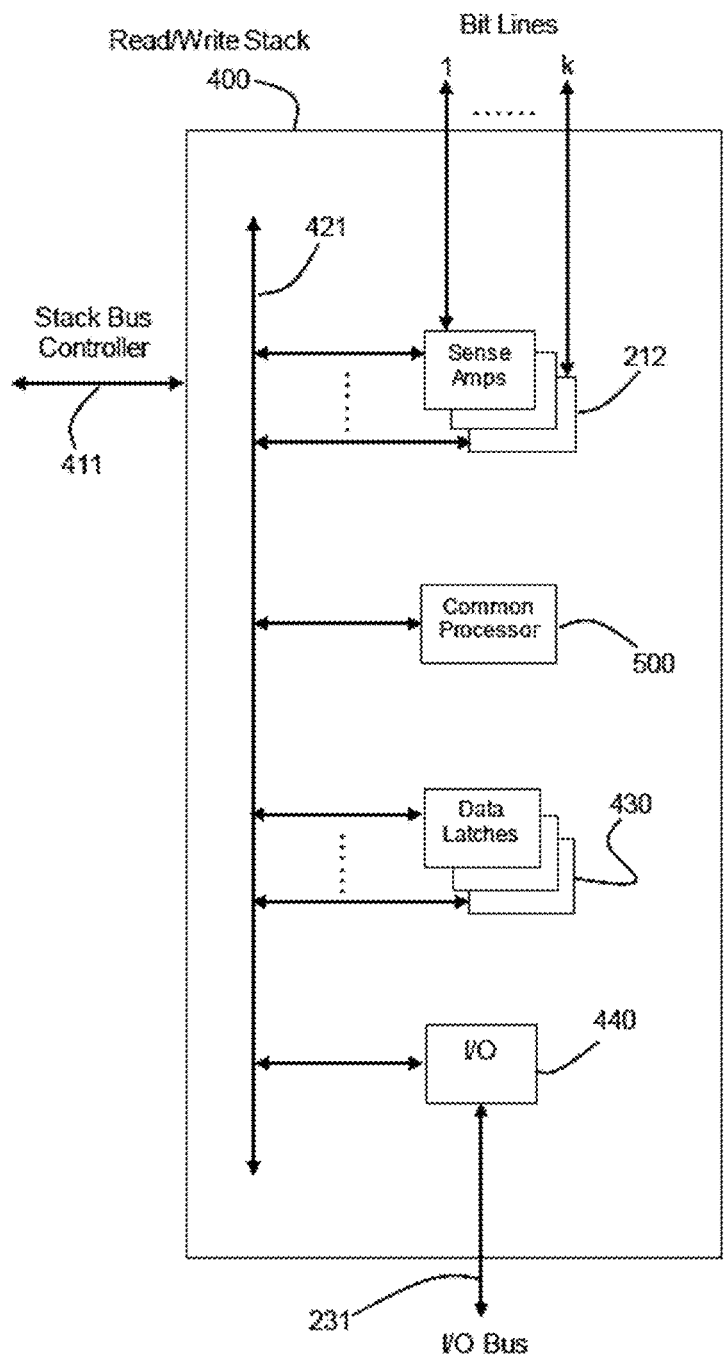
FIG. 13 – Prior Art

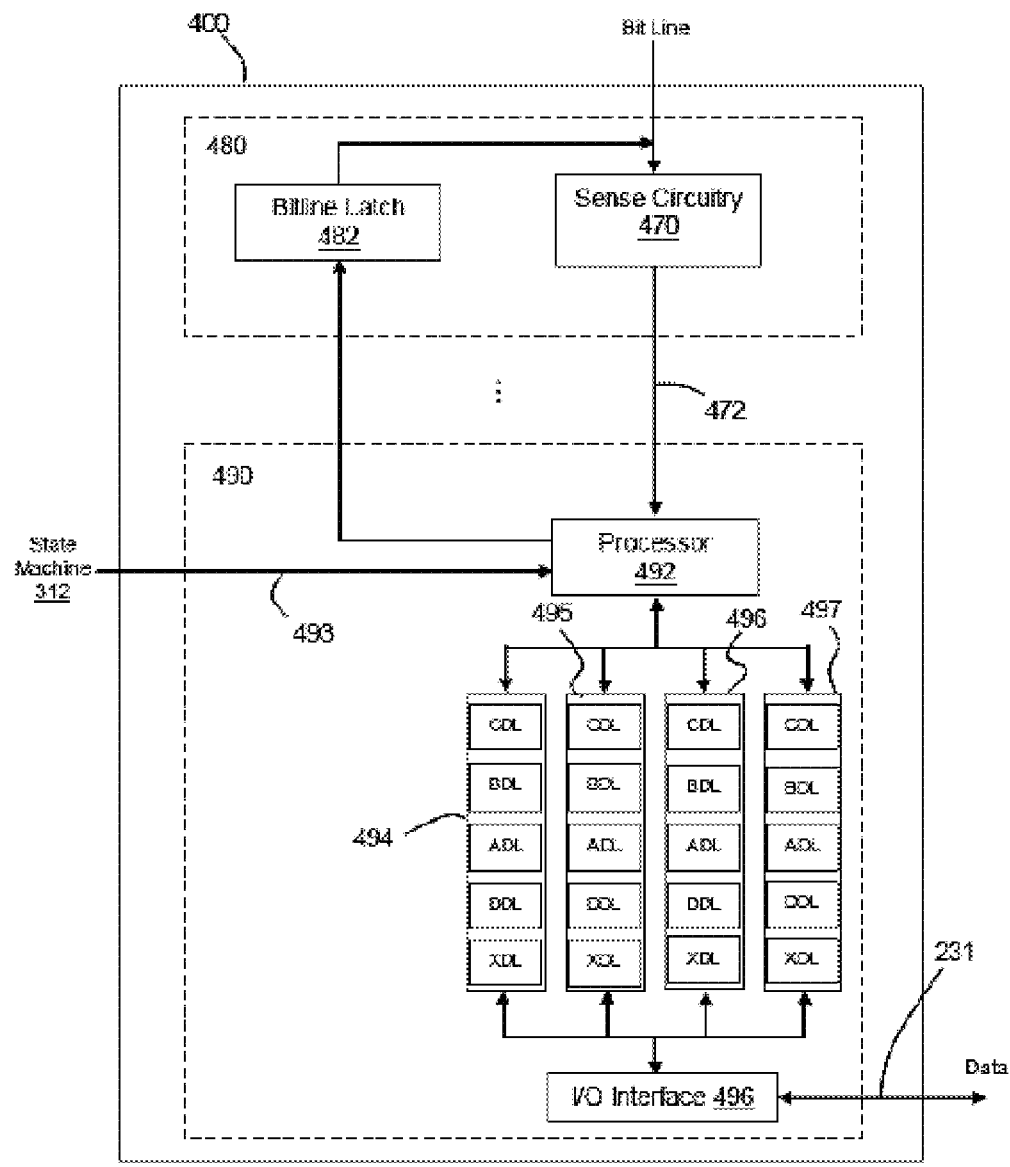
FIG. 14B – Prior Art

○ Dummy Cells
⊚ Odd Cells
⊙ Even Cells
● Cells Selected for Bit Scan

PEAK AND AVERAGE ICC REDUCTION BY TIER-BASED SENSING DURING PROGRAM VERIFY OPERATIONS OF NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for employing a tier-based sensing scheme to effectively manage fluctuations in current levels during the programming of non-volatile memory structures, thereby improving metrics related to performance and power consumption.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Advances in non-volatile memory structures have led to significant increases in their storage density capability and a reduction in their power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein a threshold voltage ($V_{th}$) of the memory cell transistor is controlled by and dependent upon the amount of charge that is retained on the transistor's floating gate. Specifically, in a switch-like manner, a minimum amount of voltage that must be applied to the control gate of the transistor before the transistor is activated to permit conduction between its source and drain regions is, therefore, determined by the level of charge being retained on the floating gate. As a result, bit-value data can be programmed onto and erased from the cell by precisely changing the level of charge on the floating gate in order to change the threshold voltage ($V_{th}$) characteristic of the transistor. In an array structure, the memory cells are addressable by word lines (rows) and bit lines (columns). One type of non-volatile memory storage defined by this general structure is referred to as NAND flash memory based upon its electrical characteristics, which resemble a NAND logic gate.

As explained in detail below, the number of bits that can be stored in an individual memory cell is dependent upon the number of distinct voltage ranges that may be partitioned within the threshold voltage ($V_{th}$) window of that memory cell. For example, to store one bit of data (referred to as a binary data), the possible threshold voltage ($V_{th}$) of a memory cell can be divided into two voltage ranges, wherein the ranges are assigned as logical data "1" and "0" respectively. Accordingly, a memory cell of this storage density order may be referred to as a "single-level cell" or SLC.

By further partitioning the threshold voltage ($V_{th}$) window of a memory cell into additional distinct voltage ranges, multiple levels of information may be stored. A memory cell of this storage density order may be referred to as a "multi-state cell" or MLC. For example, in order to store two bits of data, the threshold voltage ($V_{th}$) window of a cell can be further partitioned into four distinct voltage ranges, with each range assigned a bit value equal to, for example, "11," "10," "01," and "00." Accordingly, following an erase operation, the cell's threshold voltage ($V_{th}$) is negative, which could be defined as logic "11." As such, the positive threshold voltages ($V_{th}$) can be used for the programmed states of "10," "01," and "00." In a further example, to store three bits of data, the threshold voltage ($V_{th}$) window of a cell may be partitioned into eight distinct voltage ranges, with each range assigned a bit value equal to, for example, "111," "110," "100," "010," "011," "000," "001," and "101." A memory cell of this storage density order may be referred to as a "tri-level," "triple-level cell," or TLC.

The specific relationship between the data programmed into a memory cell and the threshold voltage ($V_{th}$) levels of the memory cell depends on the data encoding pattern or data scheme adopted for the memory cells.

Thus, a memory device that comprises multi-state data (by incorporated MLC and/or TLC-type cells) has an increased storage capacity using the same MOSFET structure and wafer size as a memory device having a lower storage density (e.g., by incorporating SLC-type cells) and, therefore, provides a comparative cost per bit savings. However, as a consequence of the increased density, the tolerances between the partitioned voltage ranges of multi-state memory cells tighten and programming occurs at a slower speed relative to a single-state memory cell because the data is programmed to multiple target threshold voltage ($V_{th}$) ranges and requires a higher level of precision during programming. The increased storage density of a multi-state memory cell decreases the available margin of error between state changes and reduces the available voltage range capacity needed to endure the stress on the silicon oxide layer over successive programming/erase cycles. As a result, in comparison to a single-state cell, the durability of a multi-state storage element is significantly less. Therefore, with respect to some applications (e.g., a segment of memory that is dedicated to a relatively high number of program/erase cycles), a programming operation comprising single-state memory cells (i.e., a SLC-type programming protocol) is best suited. Although SLC-type memory programming operations are, generally speaking, faster in comparison to the programming time ("$T_{prog}$") required for multi-state programming operations, perpetual measures for continuing to improve the efficiency in SLC-type programming operations may be implemented. In some instances, however, these measures may cause undesirable current levels or fluctuations in the memory device that could result in physical harm to the memory structure itself or produce a negative impact with respect to other device performance parameters, such as an increase in power consumption that may exceed, for example, a specified safety or efficacy tolerance threshold. Thus, there is a particular need for measures that improve programming speed for SLC-type programming operations, but that also do not produce any countereffect concerning other performance aspects of the memory device.

SUMMARY

Various embodiments include a method for programming a memory block of a non-volatile memory structure, wherein the method comprises, during a program verify operation, selecting only a partial segment of memory cells of a memory block for bit scan mode, applying a sensing bias voltage to one or more bit lines of the memory block associated with the selected memory cells, and initiating a bit scan mode of the selected memory cells.

Other embodiments include a memory controller comprising a first port configured to couple to a non-volatile memory structure, wherein the memory structure comprises a memory block. The memory controller is configured to, during a program verify operation, select only a partial segment of memory cells of the memory block for bit scan mode, apply a sensing bias voltage to one or more bit lines of the memory block associated with the selected memory cells, and initiate a bit scan mode of the selected memory cells.

Additional embodiments include a non-volatile memory system that is comprised of a memory structure and a memory controller that is coupled to the memory structure and, during a program verify operation, selecting only a partial segment of memory cells of a memory block for bit scan mode, applying a sensing bias voltage to one or more bit lines of the memory block associated with the selected memory cells, and initiating a bit scan mode of the selected memory cells.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 2 schematically depicts a non-volatile memory cell, in accordance with exemplary embodiments;

FIG. 3 depicts the relationship between a source-drain current $I_D$ and a control gate voltage $V_{CG}$ for four different charges Q1-Q4 that a floating gate of a non-volatile memory cell may be selectively storing at any one time at a fixed drain voltage, in accordance with exemplary embodiments;

FIG. 4A schematically depicts a series of NAND-type memory cells organized into a string, in accordance with exemplary embodiments;

FIG. 4B schematically depicts a two-dimensional memory cell array, comprising a plurality of NAND-type strings, such as the type depicted in FIG. 4A, in accordance with exemplary embodiments;

FIG. 5 depicts a page of memory cells being sensed or programmed in parallel, and in relation to a memory array organized in a NAND-type configuration, in accordance with exemplary embodiments;

FIGS. 6A-C depict stages of programming four states of a population of MLC-type memory cells, in accordance with exemplary embodiments;

FIG. 7 depicts a vertical NAND-type string of a three-dimensional memory array, in accordance with exemplary embodiments;

FIG. 8 is a perspective view of a representative subsection of a monolithic three-dimensional NAND-type memory array, in accordance with exemplary embodiments;

FIG. 9A is a diagrammatic illustration of a memory erase operation with respect to a programmable transistor of a two-dimensional memory structure, in accordance with exemplary embodiments;

FIG. 9B is a diagrammatic illustration of a memory erase operation with respect to a programmable transistor of a three-dimensional memory structure, in accordance with exemplary embodiments;

FIG. 10 schematically depicts a configuration of a non-volatile memory array that is accessible by read/write circuits via row and column decoders, in accordance with exemplary embodiments;

FIG. 11 is a block diagram of an individual read/write module, in accordance with an exemplary embodiment;

FIG. 13 schematically depicts various components of a read/write stack, such as the read/write stacks depicted in FIG. 12A, in accordance with exemplary embodiments;

FIG. 14B is a block diagram depicting a sense block of a read/write stack, such as the read/write stacks depicted in FIG. 12A, in accordance with exemplary embodiments;

DETAILED DESCRIPTION

Figure 1:
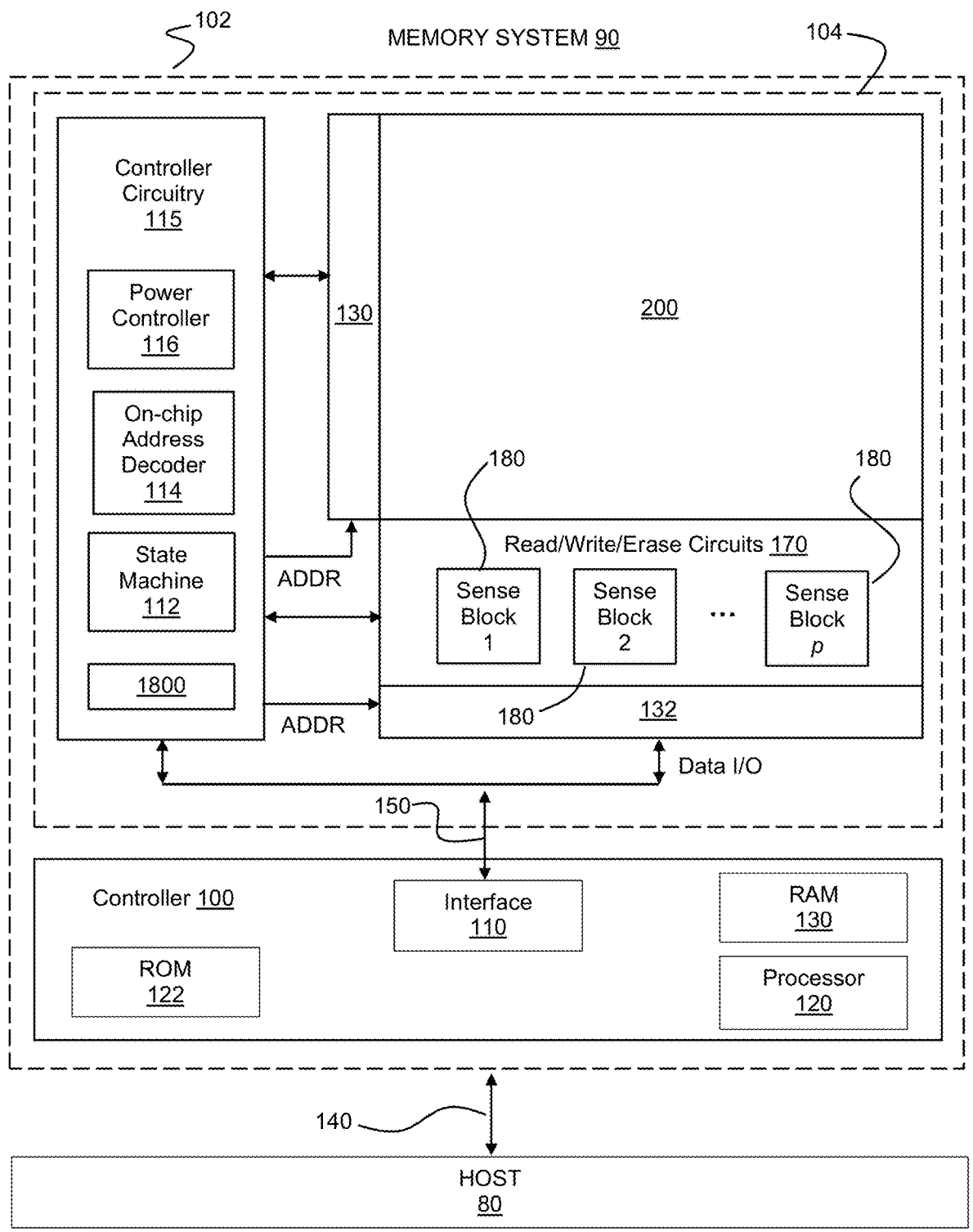
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or mores," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

FIG. 3 provides a graphical illustration of the correlation between the source-drain current $I_D$ and control gate voltage $V_{CG}$ for, for example, a non-volatile memory cell 10 having four different charge states Q1-Q4 that the floating gate may be selectively storing at any given time. As shown, with a fixed drain voltage bias, there exists four solid $I_D$ versus $V_{CG}$ curves representing four charge levels (or states) that can be programmed onto a floating gate of the memory cell, wherein the four charge levels respectively correspond to four of eight possible memory states. Therefore, as an example, the threshold voltage ($V_{th}$) window of a population of memory cells may range from 0.5 V to 3.5 V. In such an example, seven programmed memory states assigned as "0," "1," "2," "3," "4," "5," and "6," respectively, and one erased state (not shown in FIG. 3), may be demarcated by partitioning the threshold voltage ($V_{th}$) window into regions at intervals of 0.5 V each. Accordingly, if a reference current $I_{REF}$, of 2 µA is used as depicted, then a memory cell that is programmed with Q1 voltage may be considered to be in a memory state "1" as its curve intersects with $I_{REF}$ in the region of the threshold voltage ($V_{th}$) window that is demarcated by the voltage range VCG=0.5 V and 1.0 V. Similarly, Q4 is in a memory state "5."

Thus, as mentioned above, the more states that a memory cell 10 is made to store, the more finely divided is its threshold voltage ($V_{th}$) window. For example, in a memory cell 10 having a threshold voltage ($V_{th}$) window ranging from -1.5 V to 5 V, and thereby providing a possible maximum width (or distribution) of 6.5 V and storage across 16 memory states, each memory state may only occupy a voltage range of, for example, 200 mV to 300 mV. However, such a narrow voltage range will require higher precision in both the programming and read memory operations to achieve the required resolution.

According to certain exemplary embodiments, the individual memory cells 10 are organized into one or more strings, wherein each string is comprised of memory cells placed in series. For example, depicted in FIG. 4A is an exemplary embodiment of a string 50 that is comprised of NAND-type memory cells placed in a series configuration, wherein the transistor elements, i.e., $M_1, M_2, \ldots, M_n$ (in which "n" may equal 4, 8, 16, or higher), are daisy-chained at their source and drain regions. Further, as discussed above with respect to FIG. 2, each of the memory transistors 10 in a string 50 has a charge storage element 20 (e.g., a floating gate) for storing a certain amount of charge therein so as to represent an intended memory state of that memory cell, wherein each memory transistor 10 comprises a control gate 30 that allows for control over the read and write memory operations. Present at the source terminal 54 and drain terminal 56 of the string 50 are select transistors S1, S2 that control the memory transistor's connection to the outlaying memory array. Specifically, when the source select transistor S1 is turned on, source terminal 54 of string 50 is coupled to a source line (SL). Likewise, when the drain select transistor S2 is turned on, the drain terminal 56 of string 50 is coupled to a bit line (BL) of the memory array.

Expanding outward a hierarchical level, FIG. 4B is a schematic diagram depicting an exemplary embodiment of a memory array 200 (such as memory array 210) comprised of a plurality of NAND strings 50 of the type illustrated in FIG. 4A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Referring now to FIG. 5, depicted there is a detailed illustration of a bank of NAND strings 50 of a memory array 210 according to an exemplary embodiment thereof. This view is particularly useful in visualizing a row-by-row configuration of the memory array 210, wherein each row may be referred to as a physical "page." Accordingly, a physical page (e.g., page 60 denoted in FIG. 5) is a group of memory cells 10 that is enabled to be sensed or programmed in parallel. In such a configuration, a page is the smallest unit of the memory device that may be programmed or written to. Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, . . . , BLm−1, and BLm, as depicted in FIG. 5). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

To illustrate an exemplary embodiment of the programming stages of, for example, a MLC memory device that is comprised of a population of four-state memory cells, reference is made to FIGS. 6A-C.

To illustrate an exemplary embodiment of the programming stages of, for example, a MLC memory device that is comprised of a population of four-state memory cells, reference is made to FIGS. 6A-C. In FIG. 6A, there is depicted a population of memory cells in which the characteristic threshold voltage ($V_{th}$) window is divided into four distinct voltage distributions, with each distribution corresponding to a programmable memory state (i.e., memory states "0," "1," "2," and "3"). FIG. 6B illustrates an initial distribution of "erased" threshold voltages ($V_{th}$) for an erased memory. In FIG. 6C, much of the memory cell population has been programmed such that the initial "erased" threshold voltage of a given memory cell 10 is moved to a higher value into one of the three divided voltage zones that are demarcated by verify levels $vV_1$, $vV_2$, and $vV_3$. Accordingly, each memory cell can be programmed to one of the three programmable states "1," "2," and "3," or remain in the "erased" state. On a bit level, a two-bit code having, for example, a lower bit and upper bit can be used to represent each of the four memory states. For example, as depicted in FIG. 6C, the memory states "0," "1," "2," and "3" may be assigned bit values "11," "01," "00," and "10" respectively. In such example, the two-bit data may be read from the memory by sensing in a "full-sequence" mode in which the two bits are, for example, sensed together by sensing relative to the corresponding read demarcation threshold voltages—rV1, rV2, and rV3—in three sub-passes respectively.

In FIGS. 4A-B and 5 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). As a result, three-dimensional memory structures increase the storage density but consume less chip surface. For example, in FIG. 7 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 7, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 4A-B, 5 and 6, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Referring now to FIG. 8, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 8 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Returning now to the programming and erase memory operations with respect to non-volatile memory, these two operations may be generally described in the following manner. As described above, each cell comprises a floating gate MOS transistor, wherein the floating gate (FG) is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the charge trapping layer (i.e., floating gate) by applying a low voltage to the control gate and increasing the channel voltage to a high voltage, thereby creating an electric field that causes electrons to be pushed back into the semiconductor substrate. This process is diagrammatically illustrated in FIG. 9A, which generally depicts a two-dimensional NAND-type memory cell configuration 1000 comprising a control gate 1010, a floating gate 1020, and the underlying semiconductor substrate 1030 (e.g., polysilicon) comprising the memory cell's source and drain terminals (see 1040 and 1050, respectively). According to this particular embodiment, a relatively low voltage (0.5 V, for example) is applied to the control gate 1010 and a relatively high voltage VERA (20 V, for example) is applied to substrate body 1030, causing the electron charges (−) trapped at the floating gate 1020 to be pushed back into substrate 1030. Similarly, depicted in FIG. 9B is a diagrammatic view of a general erase process with respect to a three-dimensional NAND-type memory cell configuration 1100, according to an exemplary embodiment. Here, a relatively low voltage (e.g., ~0.5 V) is applied to the appropriate word line 1110 and a relatively high voltage VERA (e.g., ~20 V) is applied to a channel 1140 of the memory structure 1130, the channel being comprised of holes. As a result, the electron charges (−) are pushed out of the charge trapping layer 1120.

Referring back to the overall architecture of a memory system that is, for example, depicted in FIG. 1, a schematic depiction of a typical arrangement of a memory array of such a system is illustrated in FIG. 10. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells.

Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 11, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 10, the read/write circuits 170 are organized into banks of read/write stacks 180 wherein each read/write stack 180 is a stack of read/write modules 190.

Figure 12A:
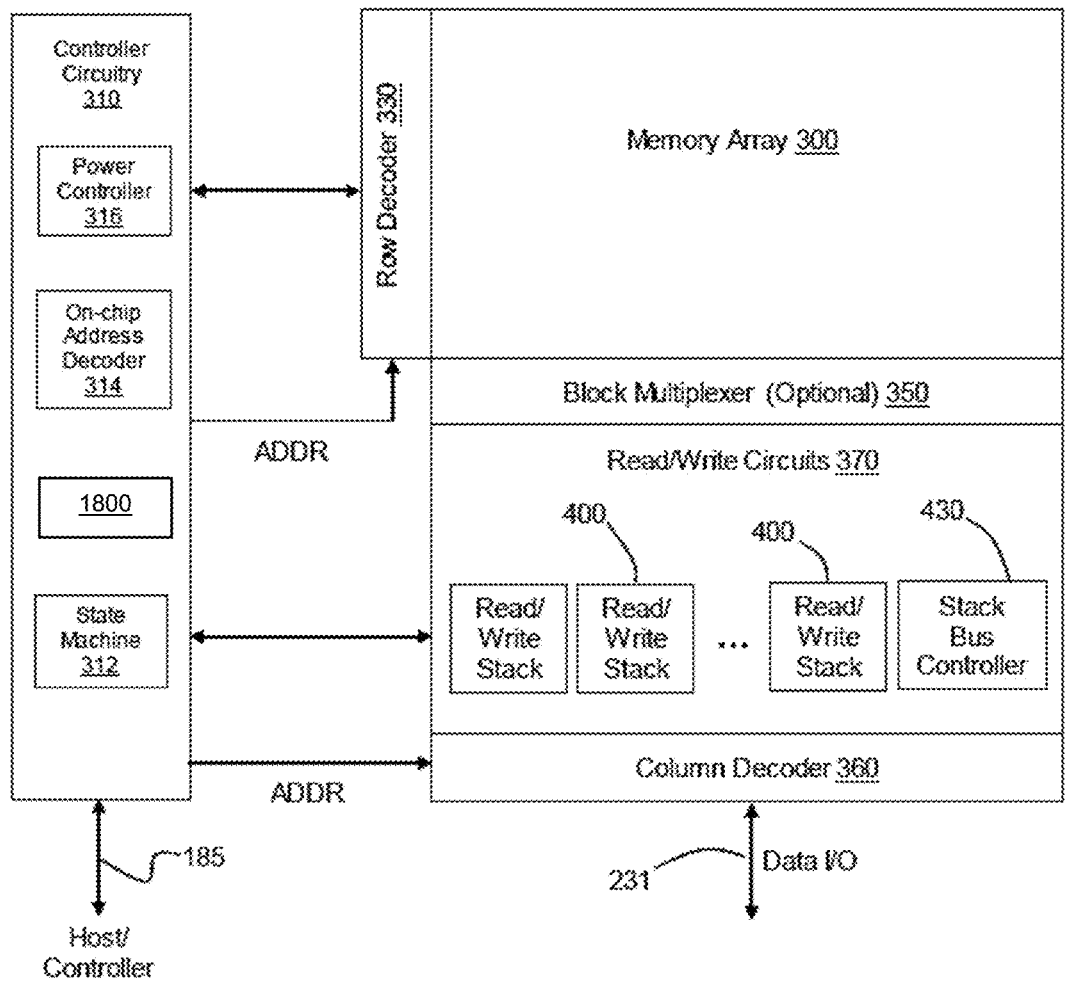
FIG. 12A schematically depicts a memory device with a bank of partitioned read/write stacks, in accordance with exemplary embodiments.

Referring now to FIG. 12A, there is shown an exemplary embodiment of a memory device (such as memory device 102 in FIG. 1, for example) that is comprised of a non-volatile memory array 300 (which may include the NAND-type SLC, MLC, TLC, and/or QLC memory cells that are in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. Memory array 300 is addressable by word lines via row decoder 330 and by bit lines via column decoder 360. Alternatively, the memory array 300 may comprise rows of memory cells partitioned into multiple blocks or pages. Hence, in such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 12B:
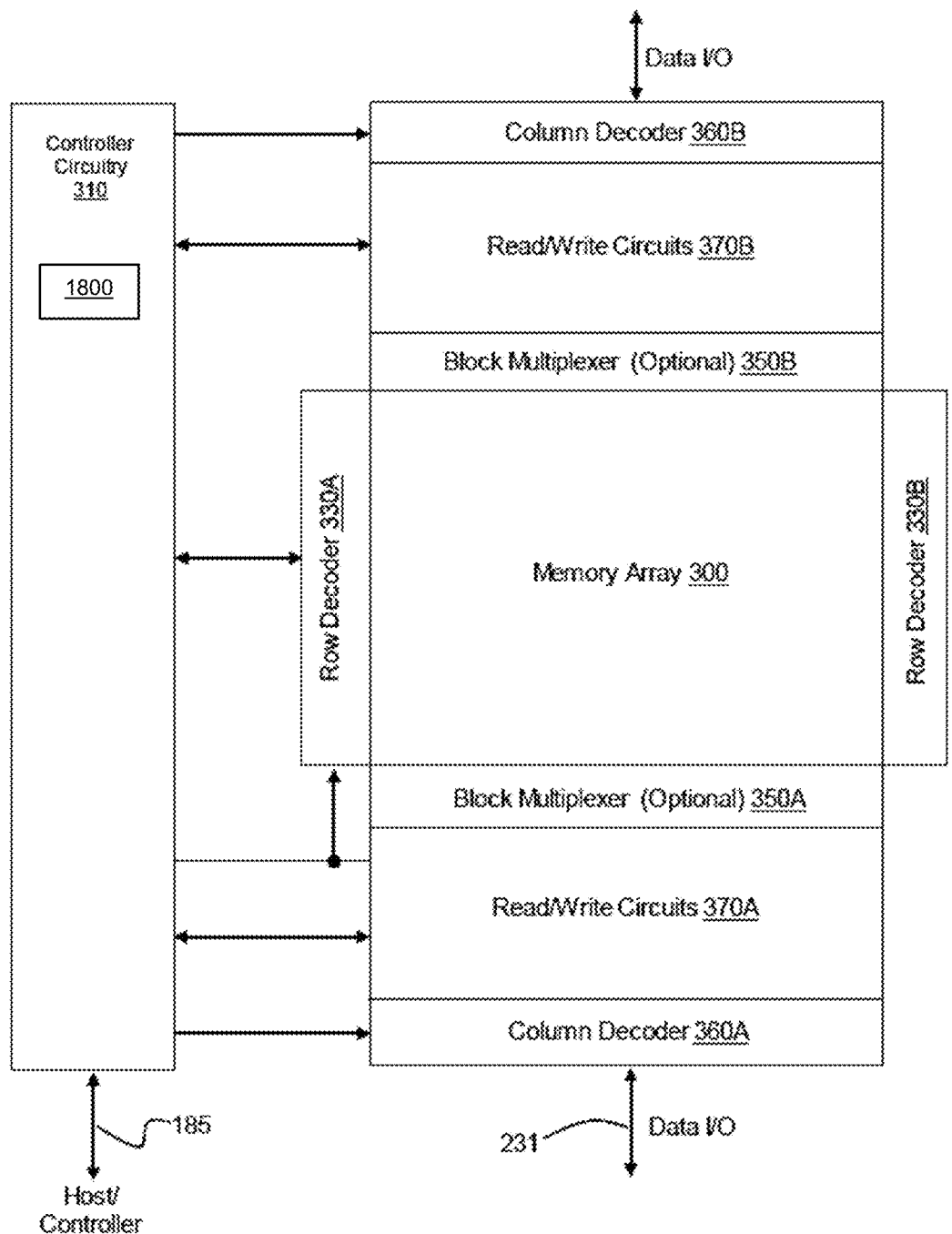
FIG. 12B schematically depicts the memory device of FIG. 12A in a slightly different configuration, in accordance with exemplary embodiments.

FIG. 12B depicts a slightly different exemplary embodiment of the memory device of FIG. 12A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 12A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 14A:
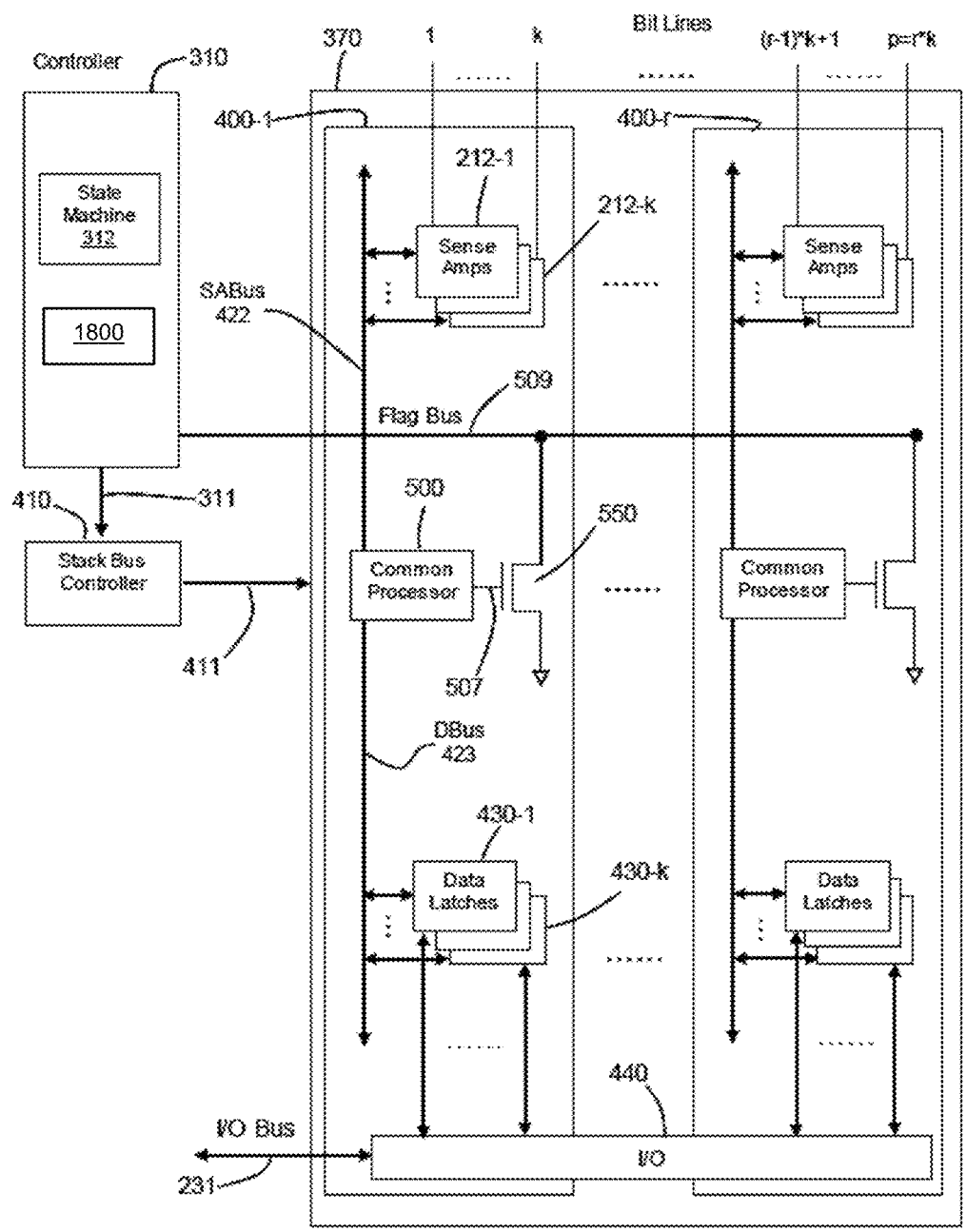
FIG. 14A schematically depicts a plurality of read/write stacks arranged amongst read/write circuits of a memory device, such as the memory device depicted in FIG. 12A, in accordance with exemplary embodiments.

Referring now to FIG. 13, there is illustrated an exemplary embodiment of certain components in a read/write stack, such as the read/write stacks 400 of FIG. 12A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 14A depicts an exemplary embodiment for incorporating the read/write stack 400 of the embodiment of FIG. 13 amongst the read/write circuits 370 of the memory devices depicted in FIGS. 12A-12B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 14A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a SABus 422 and a DBus 423, wherein SABus 422 provides for communication between the common processor 500 and the stack sense amplifiers 212-1, . . . , 212-k, and the DBus 423 provides a communication pathway between the common processor 500 and the stack of data latches 430-1, . . . , 430-k. With respect to the common processor 500, it further comprises an output 507 for output of a status signal of a memory operation, such as an error condition. As is depicted in FIG. 14A, this status signal may, for example, be used to drive a gate of a n-transistor 550 that is tied to a Flag Bus 509 in a Wired-Or configuration, wherein the Flag Bus 509 is pre-charged by the controller 310 and is pulled down when a status signal is asserted by any of read/write stacks 400-1, . . . , 400-r.

Further, an exemplary embodiment of an individual sense block (as encompassed by a read/write stack 400) is depicted in FIG. 14B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 14B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits that are determined by processor 492 during a read operation, and to store data bits imported from the data bus 231 during a programming operation which represent write data that is meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 operates in a double duty capacity, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state.

When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

As mentioned, each set of data latches 494-497 may be implemented as a stack of data latches for each sense module. In one exemplary embodiment, there are three data latches per sense module 480. In some implementations, data latches are implemented according to a shift register so that the parallel data that is stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules may be adapted in order that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's $V_{th}$ is below a particular verify level. Data latches indicate whether a storage element currently stores one or more bits from a page of data. For example, with respect to one exemplary embodiment, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

The above discussion describes just several non-limiting embodiments of non-volatile memory systems and devices. Any of these systems and devices, as well as other exemplary embodiments, can, as previously mentioned, operate in both binary forms (SLC) and multi-state or multi-level (e.g., MLC or TLC) forms, with each scheme characterized as having different comparative advantages and disadvantages, including reliability, durability, speed, and cost-per-bit considerations. For example, as described above, data can be written faster, and with less critical tolerances, in binary form in comparison to in multi-state form. This is due in part to the fact that a SLC programming scheme is comprised of a single programming loop (i.e., a single programming pulse and verify operation).

In fact, under certain conditions, the time required to complete a TLC programming process may be threefold the amount of time otherwise needed to program the same amount of data according to a SLC or MLC programming scheme. Thus, according to some data storage applications, it may be beneficial to employ a binary SLC programming scheme in totality, or alternatively, as an initial stage in an internal folding process. In such applications, various measures may be implemented to further increase the efficiency of the SLC programming operation by increasing the programming speed (i.e., by reducing the programming time, $T_{prog}$). For example, rather than performing a verify operation subsequent to each single programming pulse, it may be possible to delay a per-string, or per-memory element verify operation, until the programming of all selected strings, or memory elements, is complete. Once the programming operation is fully completed, only a single verify operation is applied to all selected strings or memory elements. As a result of this combined approach of a one pulse SLC-programming operation plus an "all string" or "all elements" select verify operation, the programming time ($T_{prog}$) is reduced while ensuring that no major failures with respect to any string (or memory element) are overlooked.

Figure 15:
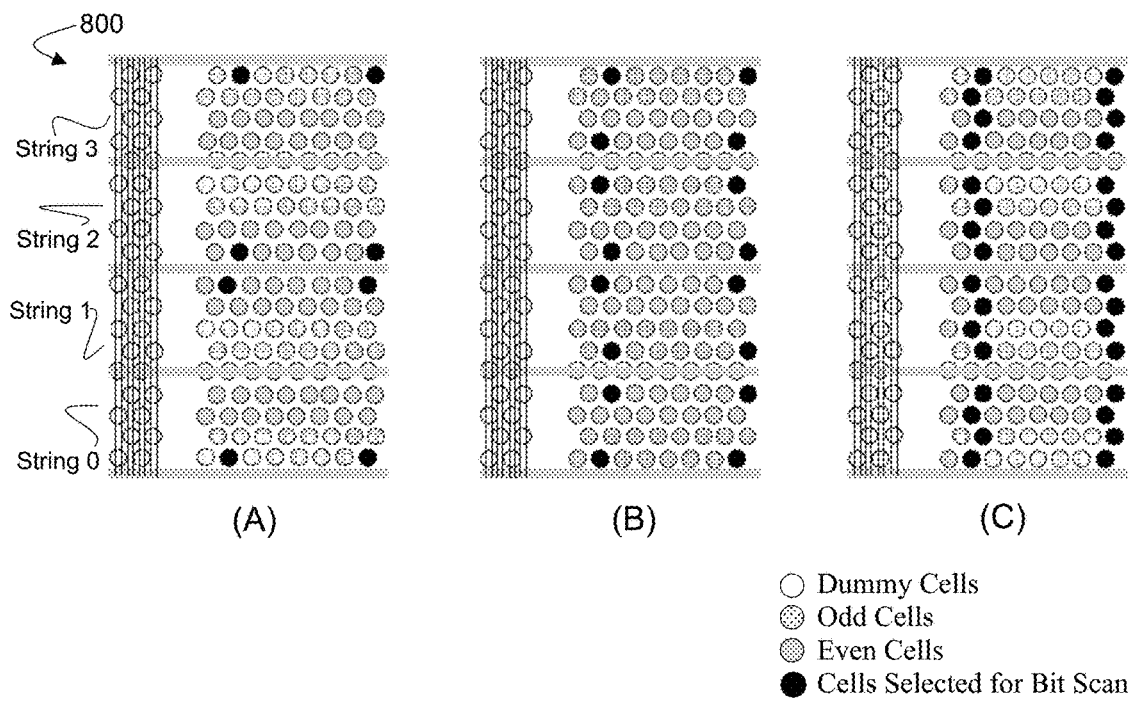
FIG. 15 depicts an incrementally-tiered approach to a bit scan process during a programming verify operation, in accordance with exemplary embodiments.
Figure 16:
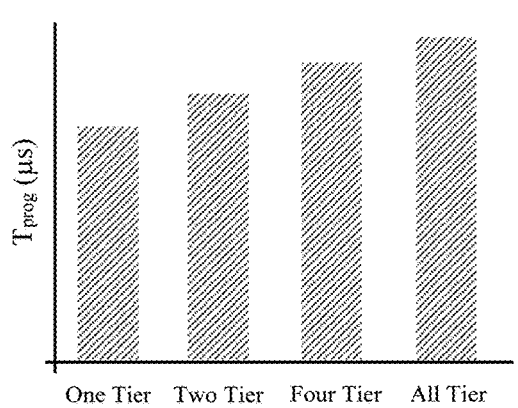
FIG. 16 is a chart depicting the comparative programming time ($T_{prog}$) (over time) of a memory structure when applying the incrementally-tiered approach depicted in FIG. 15, in accordance with exemplary embodiments.

In a further example of an efficiency-improving measure to a programming scheme according to exemplary embodiments, it may be possible to select only a portion of the memory cells for bit scan during the program verify stage, once all memory cells are sensed. FIG. 15 depicts an exemplary embodiment of three non-limiting configurations ("A," "B," and "C") in which a partial, or "tiered," bit scan procedure may be conducted. For purposes of general illustration, this approach is shown in FIG. 15 with respect to a representative section 800 of a three-dimensional non-volatile memory structure comprised of strings zero to three. In a first configuration "A," only one of every 16 memory cells (or holes) per page of programmable memory cells are selected for bit scan. Thus, this configuration may be characterized as a "one tier" approach. In a second configuration "B," two out of every 16 memory cells per page are selected for bit scan in a "two tier" approach. Further, in a third configuration "C," four out of every 16 memory cells per page are selected for bit scan in a "four tier" approach. By selecting only a portion of the cells for bit scan to determine a program pass or fail according to a tiered approach, rather than applying a bit scan operation to all cells, a considerable decrease in the programming time ($T_{prog}$) may be obtained. FIG. 16 provides a comparative analysis of the programming time ($T_{prog}$) expended to complete a bit scan operation according to experimental data obtained during a one tier, two tier, four tier, and all-tier approach. As expected, an incremental decrease in the programming time resulted from each reduction in the number of memory cells selected for bit scan. More specifically, according to this particular experimental data, a one tier approach produced a savings in programming time ($T_{prog}$) on the order of approximately 100 microseconds relative to an all-tier approach.

Figure 17:
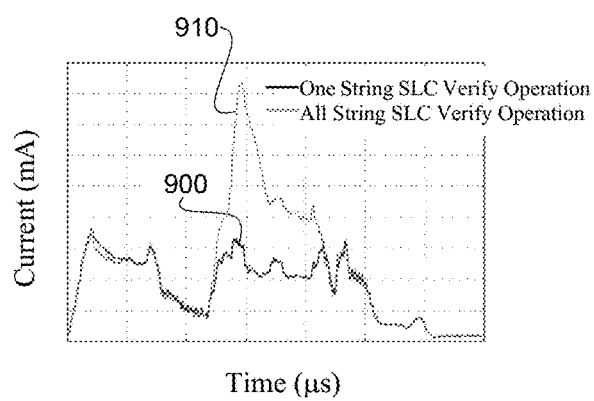
FIG. 17 is a chart depicting the comparative ICC current level (over time) through a memory structure between a single-string SLC-type programming verify operation and an all-string SLC-type programming verify operation, in accordance with exemplary embodiments.

Hence, according to certain exemplary embodiments, it may be beneficial to apply a tiered bit scan configuration in combination with an "all-string" select approach in order to conduct, for example, a program read/verify operation during a SLC-type programming scheme, as a potent two-pronged measure for improving the efficiency and speed of the programming operation. However, because it is necessary to select all strings, or memory elements, of the subject memory structure in order to apply the single ("all string") verify memory operation, a high percentage of the bit lines (BL) of the memory structure are likely to flow a high current during the verify operation as it is highly probable that a significant number of the strings, or memory elements, will be in an erased state. As such, the erased state currents will combine to form the total current flowing through the bit line. As a result, the memory structure will likely undertake a substantial peak in the peak current consumption (ICC). The chart in FIG. 17 is intended to illustrate, in general terms, this circumstance, according to observations in view of exemplary experimental data. Specifically, curve 900 represents the peak ICC (as a function of time) occurring within a representative memory structure during a single string select verify operation, according to a SLC-type programming scheme. By contrast, the curve 910 represents the peak ICC (as a function of time) occurring within the same memory structure when instead applying an "all-string" select verify operation to the programming scheme. According to this data comparison, it is readily apparent that there is a dramatic increase (e.g., ~2-3 volts) in the peak ICC in the case of the "all-string" select verify operation. Thus, although the "all-string" select verify approach may provide significant benefits with respect to the efficiency of the memory operation, a significant tradeoff appears to occur concerning power consumption (i.e., both the peak ICC and average ICC) and safety, which could amount to failing to meet critical device specifications.

Accordingly, given this observation that the peak ICC within a memory structure is significantly increased as a result of the number of bit line(s) selected during a program verify operation (due to the accumulation of the ramp up voltage/sensing current of the selected bit line(s)), it may be advantageous to modify the "all-string" select verify approach to apply the appropriate sensing bias voltage(s) only to those bit line(s) corresponding to the memory cells selected for bit scan. Thus, in a tiered bit scan configuration, only the memory cells that are selected for bit scan according to the particular tiered configuration would be sensed during the program verify operation. In this way, by narrowing the "all-string" select verify approach to include only those bit line(s) implicated in the bit scan operation, it is still possible to achieve a savings in programming time ($T_{prog}$) without a correlating, potentially dramatic, increase in the average ICC and peak ICC levels.

Figure 18:
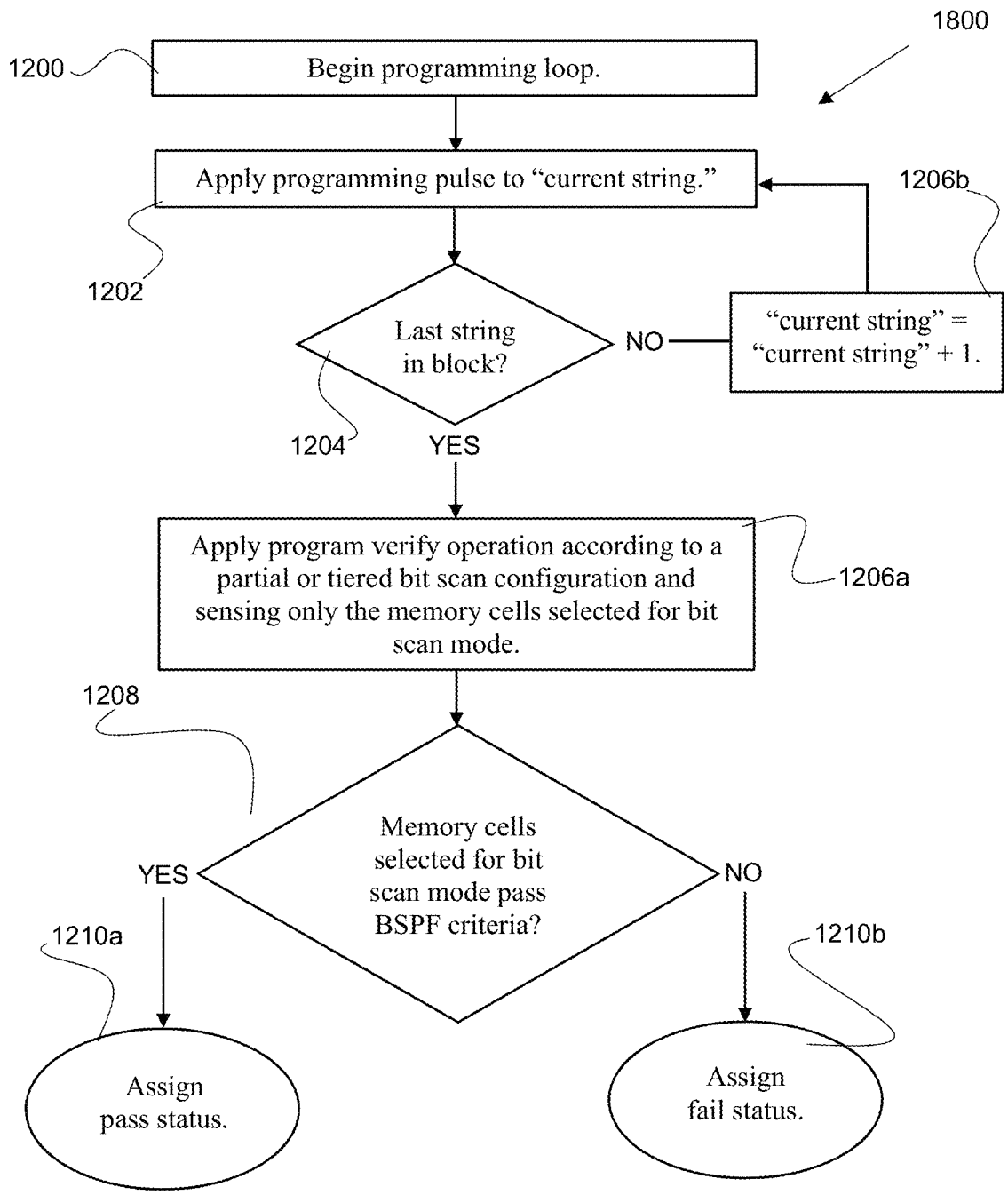
FIG. 18 is a flow diagram generally illustrating the steps of a programming loop of a target memory structure, using a corresponding tiered sensing and bit scan procedure, in accordance with exemplary embodiments.

Referring now to FIG. 18, there is provided a flow diagram illustrating a general framework of a programming scheme 1800, incorporating a combined partial or tiered sensing and (corresponding) bit scan procedure to comprise the program verify operation portion of a programming loop, according to an exemplary embodiment thereof. Beginning at step 1200, a programming sequence or loop commences in response to a generated command. In response, a first program pulse is initiated (see step 1202). The programming sequence continues until completion. For example, according to one particular embodiment, programming is completed once all of the memory strings that comprise a memory block are programmed or written to according to a specific encoding scheme (see steps 1204 and 1206b). Once the programming sequence is finished, a subsequent program verify operation is conducted (see step 1206a). Specifically, memory cells (or elements) are selected according to a tiered configuration (e.g., according to a one tier, two tier, or four tier configuration) for bit scan and, according to the selection, the appropriate sensing current/voltage is only applied to the one or more bit line(s) necessarily engaged for sensing the selected memory cells (or elements) in a program verify or read operation. Thereafter, a pass or fail status is generated for each selected memory cell (or element) according to the particular BSPF criteria (see steps 1208 and 1210a-b).

Importantly, the exemplary procedure described above with reference to FIG. 18 is intended only to provide a general outline and is not intended to limit the procedure to any particular detailed configuration. For instance, although a one tier, two tier, or four tier configurations is specifically mentioned above for determining the partial selection of memory cells (or elements) of a memory structure for bit scan, any suitable arrangement may be used according to the structure and density of a given memory structure. Furthermore, the above description is provided within the context of an SLC-type programming scheme. However, the application of a matched tiered sensing and bit scan approach may be incorporated into the program verify portion of any suitable programming scheme of non-volatile memory, such as programming schemes aimed at higher density memory structures (e.g., TLC or QLC, etc., programming schemes).

Additionally, the exemplary procedure can be applied in any programming order, including both normal order programming (NOP) or reverse order programming (ROP).

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for programming a memory block of a non-volatile memory structure, comprising:
   during a program verify operation:
      selecting only a partial segment of memory cells of a memory block for bit scan mode;
      applying a sensing bias voltage to one or more bit lines of the memory block associated with the selected memory cells; and
      initiating a bit scan mode of the selected memory cells.

2. The method according to claim 1, wherein the program verify operation is a stage of a SLC-type programming sequence.

3. The method according to claim 1, wherein the memory block is comprised of three-dimensional NAND-type memory cells.

4. The method according to claim 1, wherein the sensing bias voltage is simultaneously applied to all of the one or more bit lines.

5. The method according to claim 1, wherein the partial segment of memory cells is comprised of one out of every sixteen memory cells.

6. The method according to claim 1, wherein the partial segment of memory cells is comprised of two out of every sixteen memory cells.

7. The method according to claim 1, wherein the partial segment of memory cells is comprised of four out of every sixteen memory cells.

8. A memory controller, comprising:
   a first port configured to couple to a non-volatile memory structure, the structure comprising a memory block; and
   the memory controller configured to:
      during a program verify operation:
         select only a partial segment of memory cells of the memory block for bit scan mode;
         apply a sensing bias voltage to one or more bit lines of the memory block associated with the selected memory cells; and
         initiate a bit scan mode of the selected memory cells.

9. The memory controller according to claim 8, wherein the program verify operation is a stage of a SLC-type programming sequence.

10. The memory controller according to claim 8, wherein the memory block is comprised of three-dimensional NAND-type memory cells.

11. The memory controller according to claim 8, wherein the sensing bias voltage is simultaneously applied to all of the one or more bit lines.

12. The memory controller according to claim 8, wherein the partial segment of memory cells is comprised of one out of every sixteen memory cells.

13. The memory controller according to claim 8, wherein the partial segment of memory cells is comprised of two out of every sixteen memory cells.

14. The memory controller according to claim 8, wherein the partial segment of memory cells is comprised of four out of every sixteen memory cells.

15. A non-volatile memory system, comprising:
- a memory structure;
- a memory controller coupled to the memory structure and:
  - during a program verify operation of a memory block of the memory structure:
    - selecting only a partial segment of memory cells of a memory block for bit scan mode;
    - applying a sensing bias voltage to one or more bit lines of the memory block associated with the selected memory cells; and
    - initiating a bit scan mode of the selected memory cells.

16. The non-volatile memory system according to claim 15, wherein the program verify operation is a stage of a SLC-type programming sequence.

17. The non-volatile memory system according to claim 15, wherein the sensing bias voltage is simultaneously applied to all of the one or more bit lines.

18. The non-volatile memory system according to claim 15, wherein the partial segment of memory cells is comprised of one out of every sixteen memory cells.

19. The non-volatile memory system according to claim 15, wherein the partial segment of memory cells is comprised of two out of every sixteen memory cells.

20. The non-volatile memory system according to claim 15, wherein the partial segment of memory cells is comprised of four out of every sixteen memory cells.

\* \* \* \* \*